United States Patent
Prajuckamol et al.

(10) Patent No.: US 12,283,562 B2
(45) Date of Patent: Apr. 22, 2025

(54) CLIP DESIGN AND METHOD OF CONTROLLING CLIP POSITION

(71) Applicant: SEMICONDUCTOR COMPONENTS INDUSTRIES, LLC, Phoenix, AZ (US)

(72) Inventors: Atapol Prajuckamol, Thanyaburi (TH); Chee Hiong Chew, Seremban (MY); Vemmond Jeng Hung Ng, Senawang (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 331 days.

(21) Appl. No.: 17/658,881

(22) Filed: Apr. 12, 2022

(65) Prior Publication Data
US 2023/0326901 A1    Oct. 12, 2023

(51) Int. Cl.
*H01L 23/00*    (2006.01)

(52) U.S. Cl.
CPC ............ *H01L 24/40* (2013.01); *H01L 24/73* (2013.01); *H01L 24/84* (2013.01); *H01L 24/32* (2013.01); *H01L 2224/32225* (2013.01); *H01L 2224/4001* (2013.01); *H01L 2224/4007* (2013.01); *H01L 2224/40225* (2013.01); *H01L 2224/40997* (2013.01); *H01L 2224/73263* (2013.01); *H01L 2224/84138* (2013.01); *H01L 2224/84143* (2013.01); *H01L 2224/84345* (2013.01); *H01L 2224/84385* (2013.01); *H01L 2224/84815* (2013.01); *H01L 2924/10272* (2013.01); *H01L 2924/13055* (2013.01)

(58) Field of Classification Search
CPC ....................................................... H01L 24/40
USPC ........................................................ 257/678
See application file for complete search history.

(56) References Cited

U.S. PATENT DOCUMENTS

| | | | |
|---|---|---|---|
| 5,726,502 A * | 3/1998 | Beddingfield | .......... H01L 24/13 257/E23.179 |
| 2005/0130350 A1 | 6/2005 | Estacio et al. | |
| 2009/0057854 A1 | 3/2009 | Gomez | |
| 2013/0009295 A1 * | 1/2013 | Otremba | .................. H01L 24/83 257/676 |
| 2013/0285260 A1 | 10/2013 | Denison et al. | |
| 2014/0084433 A1 * | 3/2014 | Otremba | .................. H01L 24/34 257/676 |
| 2021/0313294 A1 * | 10/2021 | Chiang | .................... H01L 24/40 |

* cited by examiner

*Primary Examiner* — Ajay Arora
(74) *Attorney, Agent, or Firm* — Brake Hughes Bellermann LLP (57) ABSTRACT

According to an aspect, a power electronic module includes a substrate, a semiconductor die coupled to the substrate, and a clip member configured to secure the semiconductor die to the substrate, where the clip member includes a base portion having a surface coupled to the semiconductor die, an extender portion that extends from the base portion, where the extender portion includes a contact portion coupled to the substrate, and at least one protrusion that extends from the base portion or the extender portion.

20 Claims, 9 Drawing Sheets

CLIP DESIGN AND METHOD OF CONTROLLING CLIP POSITION

TECHNICAL FIELD

This description relates to a clip member for a semiconductor die.

BACKGROUND

During a conventional clip bonding process with a semiconductor die, the clip position may be difficult to control during reflow. For example, during reflow, the clip may be moved out of position. This movement is undesirable during the manufacturing process and can result in unreliable contacts and module formation.

SUMMARY

According to an aspect, a power electronic module includes a substrate, a semiconductor die coupled to the substrate, and a clip member configured to secure the semiconductor die to the substrate, where the clip member includes a base portion having a surface coupled to the semiconductor die, an extender portion that extends from the base portion, the extender portion including a contact portion coupled to the substrate, and at least one protrusion that extends from the base portion or the extender portion.

The power electronic module may include one or more of the following features (or any combination thereof). The extender portion includes a connector portion disposed between the base portion and the extender portion, where the connector portion includes one or more curved portions. The at least one protrusion may extend in a direction away from the substrate. The at least one protrusion may extend in a direction towards the substrate. The at least one protrusion may extend from the base portion. The at least one protrusion may extend from the contact portion. The at least one protrusion may include a first protrusion that extends from a first sidewall of the clip member, and a second protrusion that extends from a second sidewall of the clip member. The first protrusion and the second protrusion are configured to be inserted into a first hole and a second hole, respectively, of a guide member during a reflow process. The substrate defines a first slot and a second slot, where at least a portion of the first protrusion is disposed within the first slot, and at least a portion of the second protrusion is disposed within the second slot. The clip member may include a third protrusion that extends from the first sidewall, and a fourth protrusion that extends from the second sidewall. The first and second protrusions may extend from the base portion, and the third and fourth protrusions may extend from the contact portion. The first and second protrusions extend from the base portion, and the third and fourth protrusions extend from the base portion. The substrate may include a non-electrically conducting substrate and an electrically conducting layer coupled to at least one side of the electrically conducting substrate, where the electrically conducting layer defines at least one slot, and at least a portion of the at least one protrusion is disposed in the at least one slot.

According to an aspect, a power electronic module includes a substrate, a semiconductor die coupled to the substrate via a first adhesive portion, and a clip member configured to secure the semiconductor die to the substrate, where the clip member includes a base portion having a surface coupled to the semiconductor die via a second adhesive portion, an extender portion that extends from the base portion, where the extender portion includes a contact portion coupled to the substrate via a third adhesive portion, and a plurality of protrusions that extend from the base portion, where the plurality of protrusions is configured to be inserted into holes of a guide member.

According to some aspects, the power electronic module may include one or more of the following features (or any combination thereof). The clip member includes a first sidewall and a second sidewall such that a distance between the first sidewall and the second sidewall defines a width of the clip member, where the plurality of protrusions include a first protrusion that extends from the first sidewall and a second protrusion that extends from the second sidewall. The plurality of protrusions is a first plurality of protrusions, where the clip member includes a plurality of second protrusions that extend from the base portion. The plurality of protrusions is a first plurality of protrusions, where the clip member includes a plurality of second protrusions that extend from the contact portion.

According to an aspect, a power electronic module includes a substrate defining a first slot and a second slot, a semiconductor die coupled to the substrate via a first adhesive portion, and a clip member configured to assist with securing the semiconductor die to the substrate, where the clip member includes a base portion having a surface coupled to the semiconductor die via a second adhesive portion, an extender portion that extends from the base portion, where the extender portion includes a contact portion coupled to the substrate via a third adhesive portion, and a plurality of protrusions that extends from the contact portion, where the plurality of protrusions has a first protrusion and a second protrusion. At least a portion of the first protrusion is disposed in the first slot. At least a portion of the second protrusion is disposed in the second slot.

According to some aspects, the power electronic module may include one or more of the following features (or any combination thereof). The clip member includes a first sidewall and a second sidewall such that a distance between the first sidewall and the second sidewall defines a width of the clip member, where the first protrusion extends from the first sidewall, and the second protrusion extends from the second sidewall. The third adhesive portion is disposed between the first slot and the second slot. The substrate may include a non-electrically conducting substrate and an electrically conducting layer coupled to at least one side of the electrically conducting substrate, where the electrically conducting layer defines the first slot and the second slot.

According to an aspect, a clip member for a power electronic module includes a base portion having a surface configured to be coupled to a semiconductor die, an extender portion that extends from the base portion, where the extender portion includes a contact portion configured to be coupled to a substrate, a first sidewall that extends along the base portion and the extending portion, a second sidewall disposed opposite to the first sidewall, a first protrusion that extends from a portion of the first sidewall, and a second protrusion that extends from a portion of the second sidewall.

The details of one or more implementations are set forth in the accompanying drawings and the description below. Other features will be apparent from the description and drawings, and from the claims.

DETAILED DESCRIPTION

The present disclosure relates to a clip member having one or more surface features (e.g., protrusions) that enable the clip position to be controlled during a reflow process. For example, a power electronic module may include a substrate, a semiconductor die coupled to the substrate via a first adhesive portion, and a clip member, where the clip member is coupled to the semiconductor die via a second adhesive portion, and the clip member is coupled to the substrate via a third adhesive portion. In some examples, the clip member includes at least two protrusions that are configured to be inserted into holes of a guide member or inserted into slots on the substrate. The interaction of the protrusions with the holes and/or the slots may cause the clip member to remain in its correct position during a reflow operation. In some examples, the substrate includes a non-electrically conducting substrate (e.g., ceramic) that is covered with an electrically conducting layer (e.g., copper) on at least one side (or both sides). In some examples, the protrusions are configured to engage mounting holes (e.g., slots) formed in the electrically conducting layer (e.g., holes that are etched into the copper). In some examples, the holes are formed only in the electrically conducting layer. In some examples, the holes extend (partially) into the non-electrically conducting substrate (e.g., ceramic).

Figure 1A:
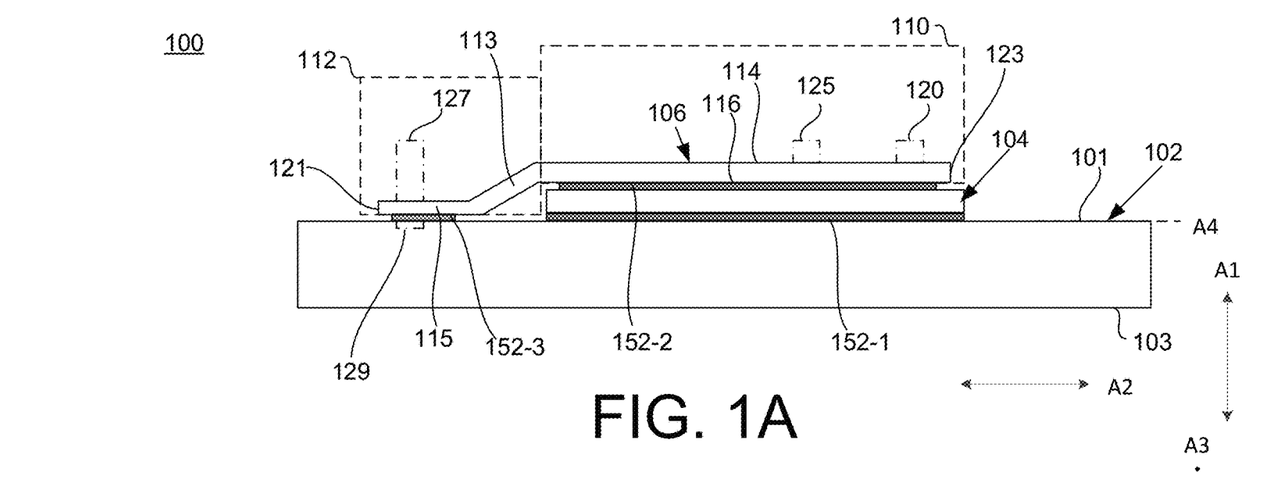
FIG. 1A illustrates a cross-sectional view of a power electronic module according to an aspect.
Figure 1B:
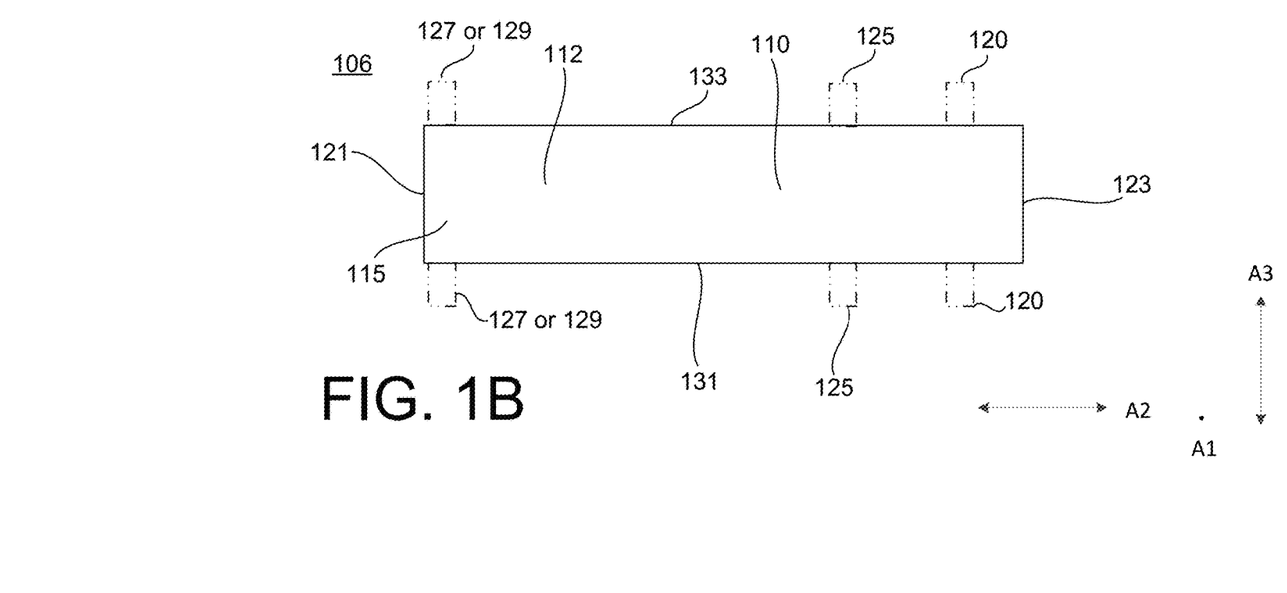
FIG. 1B illustrates an example of a clip member according to an aspect.

FIGS. 1A and 1B illustrate a power electronic module 100 according to an aspect. FIG. 1A is a cross-sectional view of the power electronic module 100 according to an aspect. FIG. 1B is a top (or bottom) view of a clip member 106 according to an aspect. The power electronic module 100 includes a substrate 102, and a semiconductor die 104 coupled to the substrate 102 via an adhesive material portion 152-1. The power electronic module 100 includes a clip member 106, where the clip member 106 is coupled to the semiconductor die 104 via an adhesive material portion 152-2 and the clip member 106 is coupled to the substrate 102 via an adhesive material portion 152-3.

The semiconductor die 104 may be any type of semiconductor device. The semiconductor die 104 may include a power converter. The semiconductor die 104 may include an electronic switch. In some examples, the semiconductor die 104 includes an insulated-gate bipolar transistor (IGBT) device. In some examples, the semiconductor die 104 includes a silicon carbide (SiC) semiconductor device.

The substrate 102 includes a dielectric material. In some examples, the substrate 102 includes a single layer of dielectric material. In some examples, the substrate 102 includes multiple layers of dielectric material. In some examples, the substrate 102 includes a printed circuit board (PCB) substrate (e.g., a single layer of PCB or multiple layers of PCB). In some examples, the substrate 102 includes a direct bonded metal (DBM) substrate (e.g., a substrate with a dielectric disposed between two metal layers that can be patterned) such as a direct bonded copper (DBC) substrate. In some examples, the substrate 102 includes a non-electrically conducting substrate (e.g., a ceramic substrate) having an electrically conducting layer (e.g., copper) coupled to one or both sides (surfaces) of the non-electrically conducting substrate. The substrate includes a first surface 101 and a second surface 103. The second surface 103 may be disposed in parallel with the first surface 101. The distance between the first surface 101 and the second surface 103 may define the thickness of the substrate 102 in the direction A1. The first surface 101 is aligned in a plane A4. A direction A1 is aligned perpendicular to the plane A4, and a direction A2 is perpendicular to the direction A1. A direction A3 into the page (shown as a dot in FIG. 1A) is aligned parallel to the plane A4 and is orthogonal to directions A1 and A2. Since FIG. 1A is a cross-sectional view (and FIG. 1B is a top/bottom view), the direction A1 in FIG. 1B is depicted as a dot. The directions A1, A2, and A3, and plane A4, are used throughout several of the various views of the implementations described throughout the figures for simplicity.

The clip member 106 is configured to assist with securing the semiconductor die 104 to the substrate 102 during a reflow process. The clip member 106 may be moved out of position during a reflow process in which the adhesive portions (e.g., 152-1, 152-2, 152-3) become heated (and relatively soft). However, the clip member 106 includes at least one protrusion (e.g., 120, 125, 127, and/or 129) configured to be inserted into at least one hole of a guide member or inserted into at least one slot on the substrate 102. The interaction of the protrusion(s) with the hole(s) and/or the slot(s) may cause the clip member 106 to remain in its correct position during a reflow operation.

The clip member 106 includes a conductive material. In some examples, the clip member 106 includes a metal-based material or multiple metal-based materials. The clip member 106 includes a first edge 121 and a second edge 123 disposed opposite to the first edge 121. The clip member 106 includes a first sidewall 131 and a second sidewall 133 disposed opposite to the first sidewall 131. The second edge 123 may be parallel with the first edge 121. The distance between the first edge 121 and the second edge 123 may define the length of the clip member 106 in the direction A2. In some examples, the first edge 121 is a flat (or substantially flat) surface that extends in the direction A1. In some examples, the first edge 121 (or a portion thereof) is linear. In some examples, the entirety of the first edge 121 is linear. The first edge 121 extends between (and connects to) the first sidewall 131 and the second sidewall 133 in the direction A3. In some examples, the second edge 123 is a flat (or substantially flat) surface that extends in the direction A1. In some examples, the second edge 123 (or a portion thereof) is linear. In some examples, the entirety of the second edge 123 is linear. The second edge 123 extends between (and connects to) the first sidewall 131 and the second sidewall 133 in the direction A3.

The first sidewall 131 may define one side surface of the clip member 106 and the second sidewall 133 may define the other side surface of the clip member 106. The second sidewall 133 may be disposed in parallel with the first sidewall 131. The first sidewall 131 may extend between (and connect to) the first edge 121 and the second edge 123. The second sidewall 133 may extend between (and connect to) the first edge 121 and the second edge 123. The distance between the first sidewall 131 and the second sidewall 133 may define a width of the clip member 106 in the direction A3. In some examples, the length of the clip member 106 is greater than the width of the clip member 106. In some examples, the first sidewall 131 and/or the second sidewall 133 includes one or more linear portions and one or more curved (or bent) portions.

The clip member 106 includes a first surface 114 and a second surface 116 disposed opposite to the first surface 114. The first surface 114 may extend between (and connect to) the first edge 121 and the second edge 123. The first surface 114 may extend between (and connect to) the first sidewall 131 and the second sidewall 133. The second surface 116 may extend between (and connect to) the first edge 121 and the second edge 123. The second surface 116 may extend between (and connect to) the first sidewall 131 and the second sidewall 133. The second surface 116 may be parallel with the first surface 114. The distance between the first surface 114 and the second surface 116 may define a thickness of the clip member 106 in the direction A1.

The clip member 106 includes a base portion 110 and an extender portion 112 that extends from the base portion 110. In some examples, the base portion 110 and the extender portion 112 represent different areas of the clip member 106. In some examples, the base portion 110 and extender portion 112 are separate areas on a single (unified) piece of material. The base portion 110 may be an area of the clip member 106 that is positioned on top of the semiconductor die 104. The extender portion 112 may be an area of the clip member 106 that extends toward the substrate 102 (in the direction A2, and, in some examples, in the direction A1) and includes an area that contacts the substrate 102. In some examples, the first edge 121 is defined by the edge of the base portion 110. In some examples, the second edge 123 is defined by the edge of the extender portion 112.

The base portion 110 may be linear (or flat). In some examples, the first surface 114 at the base portion 110 is linear (or substantially linear). In some examples, the second surface 116 at the base portion 110 is linear (or substantially linear). The base portion 110 is coupled to the semiconductor die 104 via the adhesive material portion 152-2. In some examples, the adhesive material portion 152-1, the adhesive material portion 152-2, and the adhesive material portion 152-3 include a solder material. In some examples, the second surface 116 at the base portion 110 is coupled to the semiconductor die 104 via the adhesive material portion 152-2. In some examples, the second surface 116 at the base portion 110 is considered a contact portion that is coupled to the top surface of the semiconductor die 104.

The extender portion 112 includes a contact portion 115 that is coupled to the substrate 102 via the adhesive material portion 152-3. In some examples, the first surface 114 at the contact portion 115 is linear (or flat). In some examples, the first surface 114 at the contact portion 115 is aligned in a plane that is parallel with the plane A4. In some examples, the second surface 116 at the contact portion 115 is aligned in a plane that is parallel with the plane A4. In some examples, the second surface 116 at the contact portion 115 is linear (or flat). In some examples, the contact portion 115 is disposed at a location that is offset from a location of the base portion 110 in the direction A1. In some examples, the contact portion 115 is disposed below the base portion 110 in the direction A1. In some examples, the first surface 114 at the contact portion 115 is disposed below the second surface 116 at the base portion 110. In some examples, at least a portion of the contact portion 115 is aligned with a portion of the semiconductor die 104 in the direction A2. In some examples, the first surface 114 and/or the second surface 116 at the contact portion 115 is aligned with at least a portion of the semiconductor die 104 in the direction A2.

The extender portion 112 includes a connector portion 113 that extends between the contact portion 115 and the base portion 110. In some examples, the connector portion 113 includes one or more curved portions that connect the contact portion 115 with the base portion 110. In some examples, the connector portion 113 includes one or more curved portions and one or more linear portions. In some examples, the connector portion 113 includes a curved portion that curves or bends away from the plane A4 (e.g., upwards), a central portion that is substantially flat, and a curved portion that curves or bends towards the plane A4 (e.g., downwards).

In some examples, the clip member 106 includes at least one protrusion 120. In some examples, the clip member 106 includes a single protrusion 120. In some examples, the clip member 106 includes multiple protrusions 120 (e.g., two protrusions 120 or more than two protrusions 120). In some examples, the protrusion(s) 120 can be inserted into corresponding hole(s) on a guide member (not shown in FIGS. 1A and 1B) when the guide member is placed on top of the clip member 106. The guide member is shown in further detail with respect to FIGS. 2A through 2G. In some examples, the protrusion(s) 120 extend from the base portion 110 in the direction A1. In some examples, the protrusion(s) 120 may be considered horn member(s) (e.g., because they project upwards away from the top surface of the clip member 106). In some examples, the protrusion(s) 120 extend from a sidewall of the clip member 106 (e.g., the first sidewall 131 and/or the second sidewall 133). The protrusion(s) 120 may have a portion that extends in the direction A3 and a portion that extends in the direction A1. In some examples, the protrusions 120 may include a protrusion 120 that extends from the first sidewall 131, and a protrusion 120 that extends from the second sidewall 133. In some examples, a protrusion 120 may extend from the first sidewall 131 at a location along the direction A2 that is the same as the location of the protrusion 120 along the second sidewall 133. The protrusions 120 have a height that extends in the direction A1.

In some examples, the clip member 106 includes at least one protrusion 125. In some examples, the clip member 106 includes a single protrusion 125. In some examples, the clip member 106 includes multiple protrusions 125 (e.g., two protrusions 125 or more than two protrusions 125). In some examples, the clip member 106 may define another set of protrusions (e.g., the protrusions 125) that extend from the base portion 110. In some examples, the clip member 106 defines two protrusions (e.g., protrusions 120 or protrusions 125). In some examples, the clip member 106 defines four protrusions (e.g., protrusions 120 and protrusions 125). In some examples, the protrusions 120 and/or the protrusions 125 can be inserted into corresponding holes (e.g., two holes or four holes) on a guide member (not shown in FIGS. 1A and 1B) when the guide member is placed on top of the clip member 106. In some examples, similar to the protrusions 120, the protrusions 125 extend from the base portion 110 in the direction A1. In some examples, the protrusions 125 may be considered horn members (e.g., because they project upwards away from the top surface of the clip member 106). In some examples, the protrusions 125 extend from the sidewalls, e.g., the first sidewall 131 and the second sidewall 133. For example, the protrusions 125 may include a protrusion 125 that extends from the first sidewall 131, and a protrusion 125 that extends from the second sidewall 133. In some examples, a protrusion 125 may extend from the first sidewall 131 at a location along the direction A2 that is the same as the location of the protrusion 125 along the second sidewall 133. The protrusions 125 have a height that extends in the direction A1. In some examples, the height of the protrusions 125 is the same as the height of the protrusions 120.

In some examples, the clip member 106 includes at least one protrusion 127 that extend in the direction A1 in a direction away (upwards) from the substrate 102. In some examples, the clip member 106 includes a single protrusion 127. In some examples, the clip member 106 includes multiple protrusions 127 (e.g., two protrusions 127 or more than two protrusions 127). In some examples, the clip member 106 may define another set of protrusions (e.g., the protrusions 127), but the protrusions 127 extend from the contact portion 115 (as opposed to the base portion 110). In some examples, the clip member 106 defines two protrusions (e.g., protrusions 120, protrusions 125, or protrusions 127). In some examples, the clip member 106 defines four protrusions (e.g., protrusions 127 and protrusions 120, or protrusions 127 and protrusions 125). In some examples, the clip member 106 defines six protrusions (e.g., protrusions 127, protrusions 125, and protrusions 120). In some examples, the protrusions 127, the protrusions 120 and/or the protrusions 125 can be inserted into corresponding holes (e.g., two holes, four holes, or six holes) on a guide member (not shown in FIGS. 1A and 1B) when the guide member is placed on top of the clip member 106. The protrusions 127 extend from the contact portion 115 in the direction A1. In some examples, the protrusions 127 may be considered horn members (e.g., because they project upwards away from the top surface of the clip member 106). In some examples, the protrusions 127 extend from the sidewalls, e.g., the first sidewall 131 and the second sidewall 133. In some examples, the protrusions 127 include a portion that extends in the direction A3 and a portion that extends in the direction A1. The protrusions 127 may include a protrusion 127 that extends from the first sidewall 131, and a protrusion 127 that extends from the second sidewall 133. In some examples, a protrusion 127 may extend from the first sidewall 131 at a location along the direction A2 that is the same as the location of the protrusion 127 along the second sidewall 133. The protrusions 127 have a height that extends in the direction A1. In some examples, the protrusions 127 have a height higher than the height of the protrusions 125 and/or the protrusions 120.

In some examples, the clip member 106 includes at least one protrusion 129 that extends in the direction A1 towards (e.g., downward towards) the substrate 102. In some examples, the clip member 106 includes a single protrusion 129. In some examples, the clip member 106 includes multiple protrusions 129 (e.g., two protrusions 129 or more than two protrusions 129). In some examples, the protrusions 129 are considered leg members (e.g., because they extend towards the substrate 102/the plane A4 and they are below the body of the clip member 106). The protrusions 129 may extend from the contact portion 115. In some examples, the protrusions 129 have a portion that extends from the contact portion 115 in the direction A3 and a portion that extends from the contact portion 115 in the direction A1. In some examples, the substrate 102 defines slots (e.g., mounting holes) (not shown in FIGS. 1A and 1B) that are configured to receive at least a portion of the protrusions 129. In some examples, the slots are formed (e.g., etched) into the electrically conducting layer (e.g., copper layer) of the substrate 102. In some examples, the slots extend into the non-electrically conducting material (e.g., ceramic substrate) of the substrate 102. The slots may include a first slot that receives at least a portion of a protrusion 129 and a second slot that receives at least a portion of a protrusion 129. In some examples, the adhesive material portion 152-3 is disposed between the first slot and the second slot.

FIGS. 2A through 2G illustrate a power electronic module 200 according to an aspect. The power electronic module 200 includes a substrate 202, and a semiconductor die 204 coupled to the substrate 202 via an adhesive material portion 252-1. The power electronic module 200 includes a clip member 206, where the clip member 206 is coupled to the semiconductor die 204 via an adhesive material portion 252-2 and the clip member 206 is coupled to the substrate 202 via an adhesive material portion 252-3.

Figure 2A:
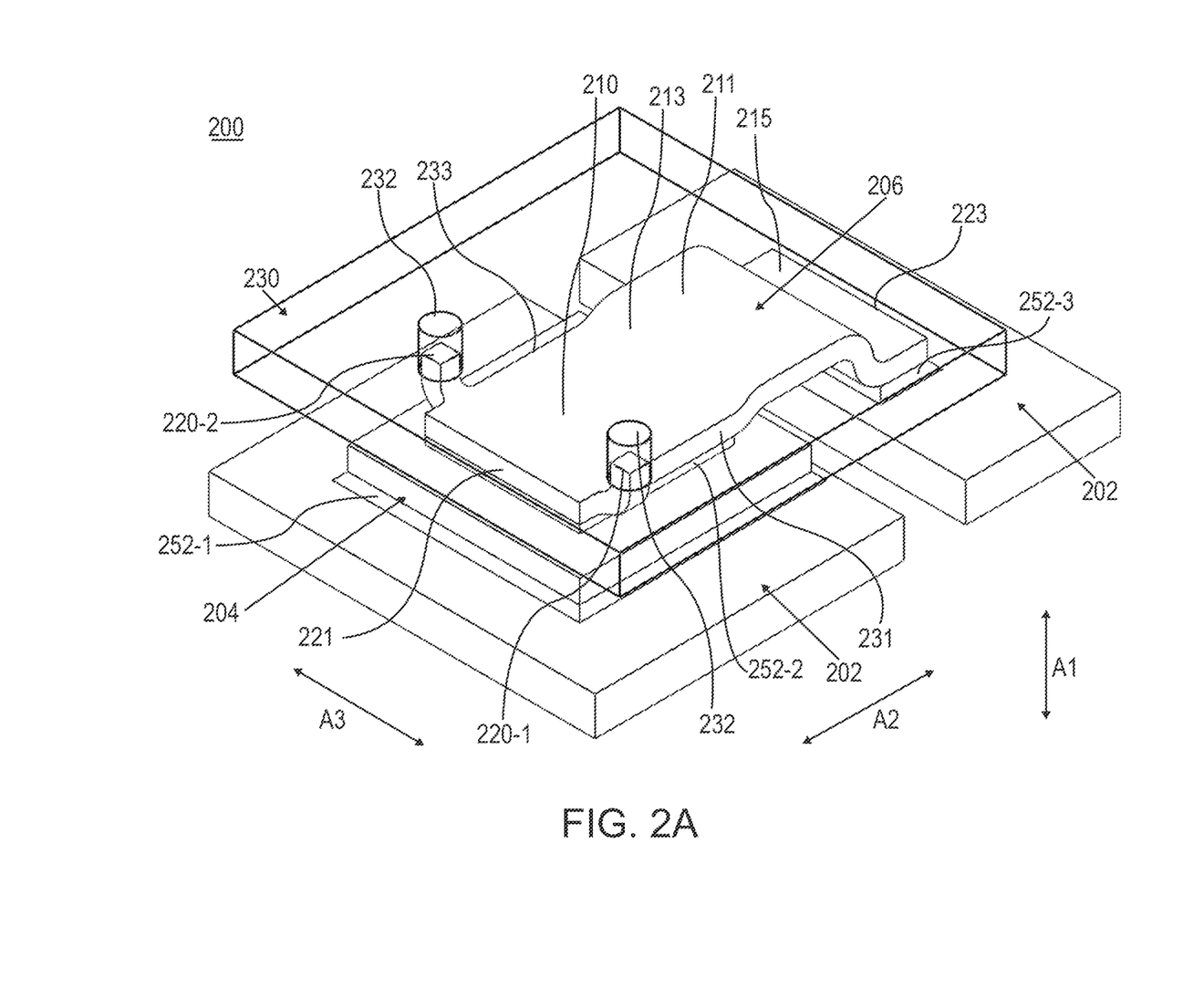
FIG. 2A illustrates a power electronic module having a semiconductor die, a substrate, a clip member, and a guide member according to an aspect.
Figure 2B:
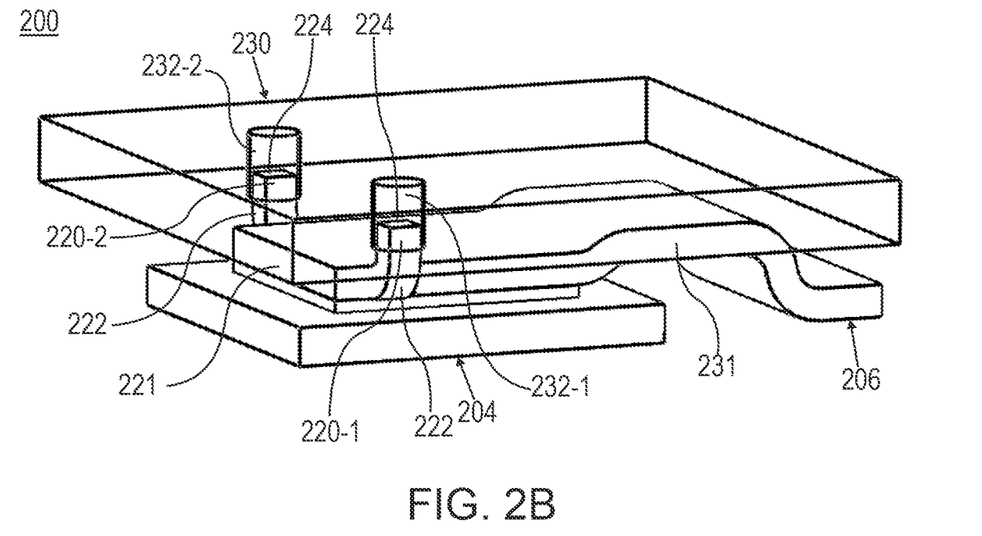
FIG. 2B illustrates the semiconductor die, the clip member, and the guide member according to an aspect.
Figure 2C:
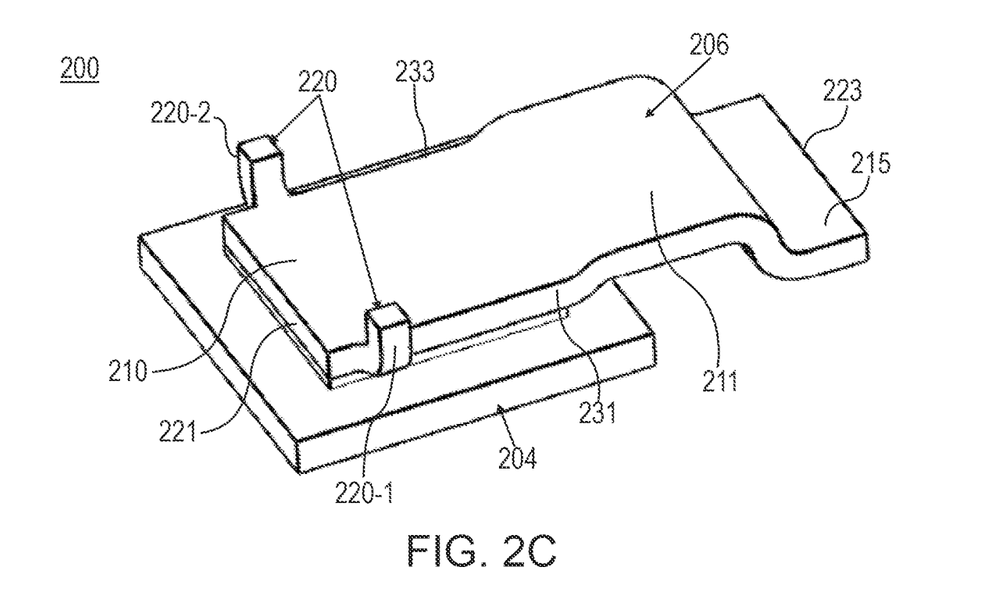
FIG. 2C illustrates a perspective of the clip member according to another aspect.
Figure 2D:
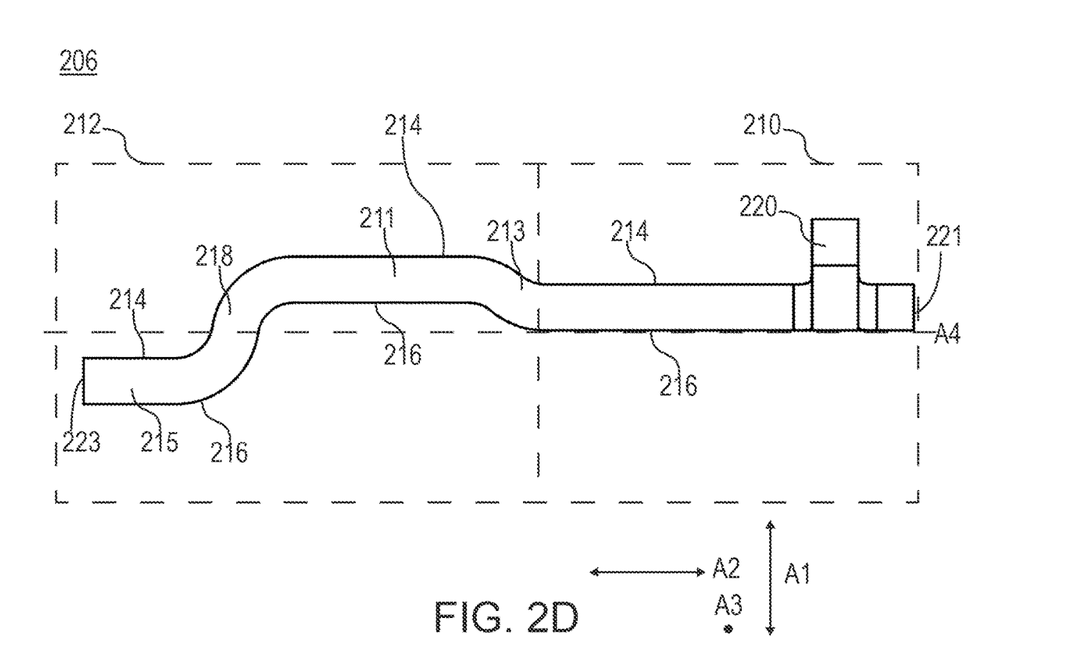
FIG. 2D illustrates a side view of the clip member according to an aspect.
Figure 2E:
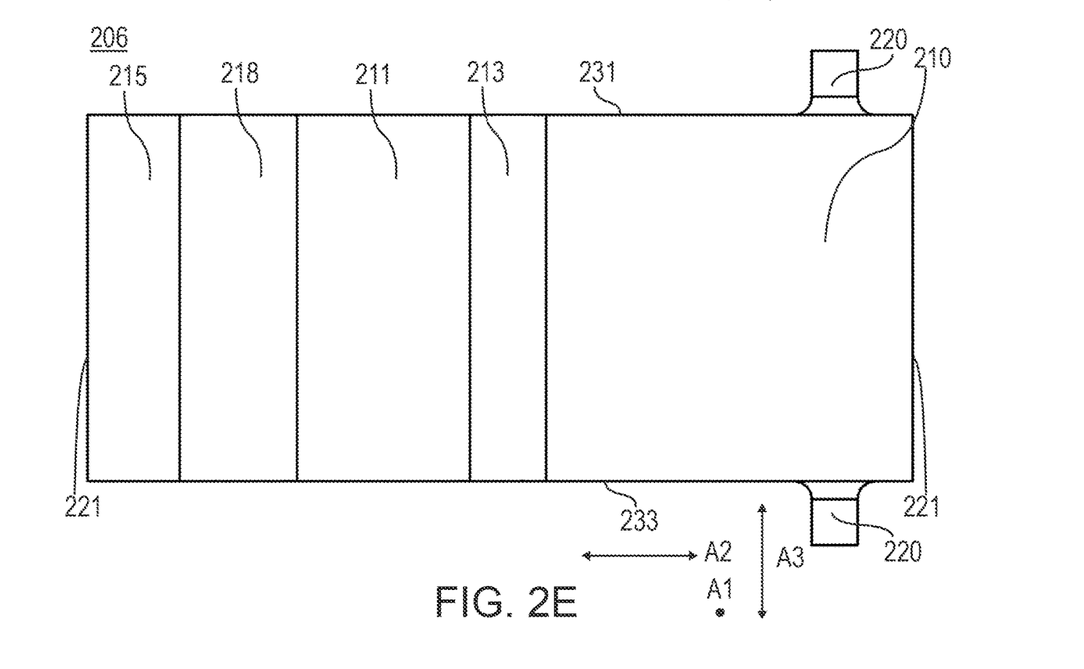
FIG. 2E illustrates a top view of the clip member according to an aspect.
Figure 2F:
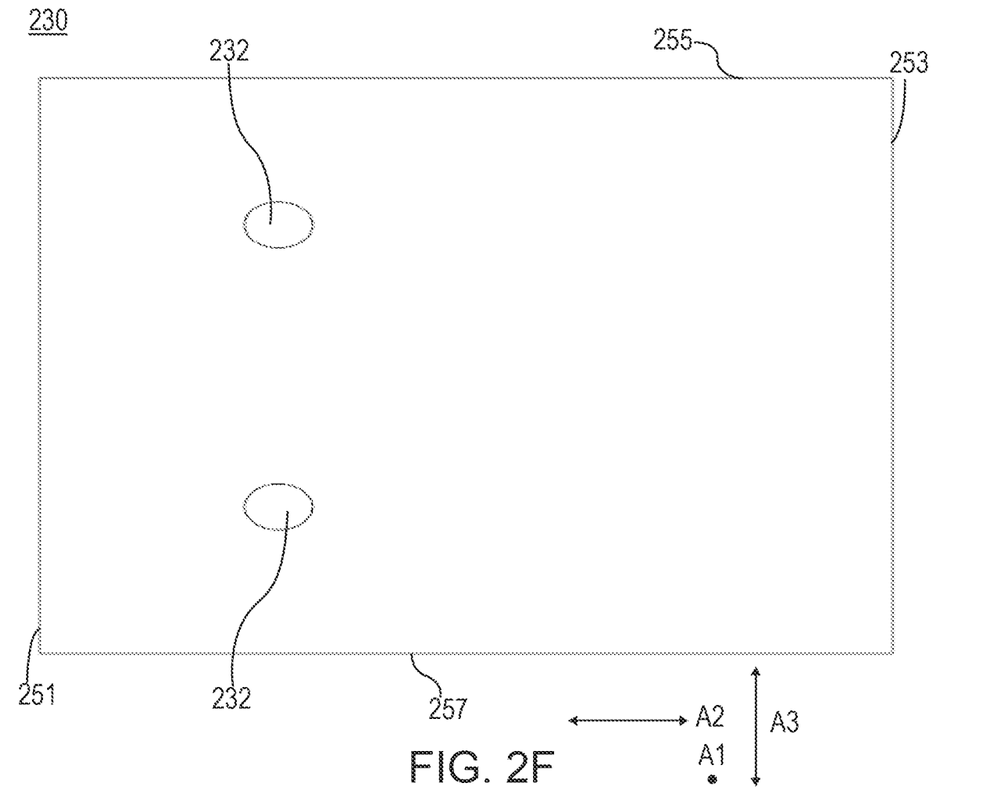
FIG. 2F illustrates a bottom view of the guide member according to an aspect.
Figure 2G:
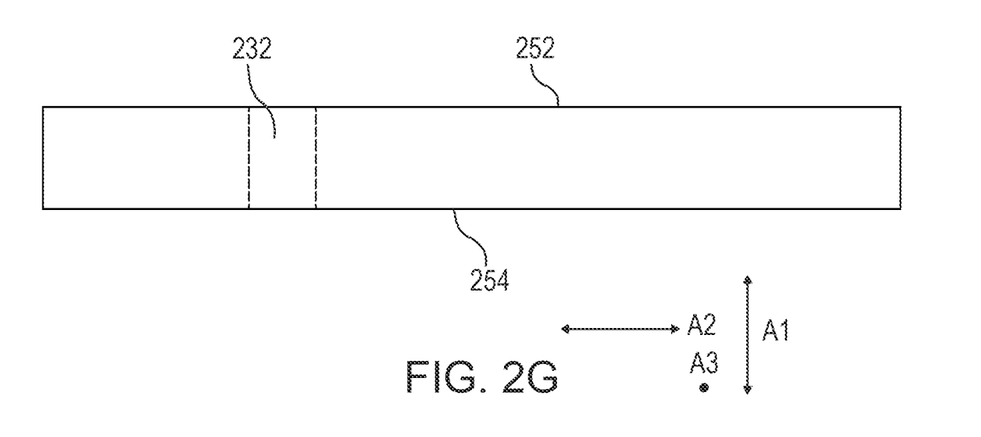
FIG. 2G illustrates a side view of the guide member according to an aspect.

FIG. 2A illustrates a power electronic module 200 having the substrate 202, the semiconductor die 204, the clip member 206, and a guide member 230 placed on top of the clip member 206, where the guide member 230 is configured to assist with keeping the clip member 206 in position during a reflow process. FIG. 2B illustrates the semiconductor die 204, the clip member 206, and the guide member 230. FIG. 2C illustrates another perspective of the clip member 206 that is coupled to the semiconductor die 204. FIG. 2D illustrates a side view of the clip member 206. FIG. 2E illustrates a top view of the clip member 206. FIG. 2F illustrates a bottom view of the guide member 230. FIG. 2G illustrates a side view of the guide member 230.

The clip member 206 is configured to assist with securing the semiconductor die 204 to the substrate 202 during a reflow process. In some examples, as explained above, the clip member 206 may become out of position during a reflow process in which the adhesive portions (e.g., 252-1, 252-2, 252-3) become heated (and soft). However, the clip member 206 includes a plurality of protrusions 220 that are configured to interact with a guide member 230 in order to assist with keeping the clip member 206 in position during a reflow process. In some examples, after the reflow process, the guide member 230 is then removed from the power electronic module 200. For example, the guide member 230 may not be part of the final product. When the guide member 230 is placed on top of the clip member 206, at least a portion of the protrusions 220 are inserted into holes 232 defined by the guide member 230. In some examples, the protrusions 220 include a first protrusion 220-1 and a second protrusion 220-2. However, the number of protrusions 220 may be greater than two such as three protrusions, four protrusions, or more than four protrusions. In some examples, the protrusions 220 may be considered or referred to as horn members.

Before the reflow process, the guide member 230 may be placed on top of the clip member 206 such that at least a portion of the protrusions 220 enter the holes 232 defined by the guide member 230. Then, during the reflow process, the adhesive material portions (e.g., 252-1, 252-2, 252-3) may be heated, but the guide member 230 may remain fixed on top of the clip member 206, thereby securing the clip member 206 in the correct location with respect to the semiconductor die 204 and/or the substrate 202. As a result, the interaction of the surface features (e.g., protrusions 220) with the holes 232 of the guide member 230 during the reflow process can minimize or prevent the clip member 206 from being moved to an incorrect position. The guide member 230 may be then removed from the power electronic module 200 (e.g., detached from the clip member 206) after the reflow process. For instance, in some examples, the guide member 230 is not included in the final product.

The clip member 206 includes a conductive material. In some examples, the clip member 206 includes a metal-based material or multiple metal-based materials. The clip member 206 includes a first edge 221 and a second edge 223 disposed opposite to the first edge 221. The clip member 206 includes a first sidewall 231 and a second sidewall 233 disposed opposite to the first sidewall 231. In some examples, the first edge 221 is the front edge of the clip member 206 and/or the edge of the clip member 206 that is more proximate to the semiconductor die 206. In some examples, the second edge 223 is the back edge of the clip member 206 and/or the edge of the clip member 206 is positioned away from the semiconductor die 206. The second edge 223 may be parallel with the first edge 221. The distance between the first edge 221 and the second edge 223 may define the length of the clip member 206 in the direction A2. In some examples, the first edge 221 is a flat (or substantially flat) surface that extends in the direction A1. In some examples, the first edge 221 (or a portion thereof) is linear. In some examples, the entirety of the first edge 221 is linear. The first edge 221 extends between (and connects to) the first sidewall 231 and the second sidewall 233 in the direction A3. In some examples, the second edge 223 is a flat (or substantially flat) surface that extends in the direction A1. In some examples, the second edge 223 (or a portion thereof) is linear. In some examples, the entirety of the second edge 223 is linear. The second edge 223 extends between (and connects to) the first sidewall 231 and the second sidewall 233 in the direction A3.

The first sidewall 231 may define one side surface of the clip member 206 and the second sidewall 233 may define the other side surface of the clip member 206. The second sidewall 233 may be parallel with the first sidewall 231. The first sidewall 231 may extend between (and connect to) the first edge 221 and the second edge 223. The second sidewall 233 may extend between (and connect to) the first edge 221 and the second edge 223. The distance between the first sidewall 231 and the second sidewall 233 may define a width of the clip member 206 in the direction A3. In some examples, the length of the clip member 206 is greater than the width of the clip member 206. In some examples, the first sidewall 231 and/or the second sidewall 233 includes one or more linear portions and one or more curved (or bent) portions.

The clip member 206 includes a first surface 214 and a second surface 216 disposed opposite to the first surface 214. The first surface 214 may extend between (and connect to) the first edge 221 and the second edge 223. The first surface 214 may extend between (and connect to) the first sidewall 231 and the second sidewall 233. The second surface 216 may extend between (and connect to) the first edge 221 and the second edge 223. The second surface 216 may extend between (and connect to) the first sidewall 231 and the second sidewall 233. The second surface 216 may be parallel with the first surface 214. The distance between the first surface 214 and the second surface 216 may define a thickness of the clip member 206 in the direction A1.

The clip member 206 includes a base portion 210 and an extender portion 212 that extends from the base portion 210. In some examples, the base portion 210 and the extender portion 212 represent different areas of the clip member 206. In some examples, the base portion 210 and extender portion 212 are separate areas on a single (unified) piece of material. The base portion 210 may be an area of the clip member 206 that is positioned on top of the semiconductor die 204. The extender portion 212 may be an area of the clip member 206 that extends toward the substrate 202 (in the direction A2) and includes an area that contacts the substrate 202. In some examples, the first edge 221 is defined by the edge of the base portion 210. In some examples, the second edge 223 is defined by the edge of the extender portion 212.

The base portion 210 may be linear (or flat). In some examples, the first surface 214 at the base portion 210 is linear (or substantially linear). In some examples, the second surface 216 at the base portion 210 is linear (or substantially linear). The base portion 210 is coupled to the semiconductor die 204 via the adhesive material portion 252-2. In some examples, the second surface 216 at the base portion 210 is coupled to the semiconductor die 204 via the adhesive material portion 252-2. In some examples, the second surface 216 at the base portion 210 is considered a contact portion that is coupled to the top surface of the semiconductor die 204. The second surface 216 at the base portion 210 is aligned in a plane A4. In some examples, the top surface of the semiconductor die 204 (and the bottom surface of the semiconductor die 204) is aligned in a plane that is parallel with the plane A4. A direction A1 is aligned perpendicular to the plane A4, and a direction A2 is perpendicular to the direction A1. A direction A3 into the page (shown as a dot in FIGS. 2D, 2G) is aligned parallel to the plane A4 and is orthogonal to directions A1 and A2. The directions A1, A2, and A3, and plane A4, are used throughout several of the various views of the implementations described throughout the figures for simplicity.

The extender portion 212 includes a contact portion 215 that is coupled to the substrate 202 via the adhesive material portion 252-3. In some examples, the first surface 214 at the contact portion 215 is linear (or flat). In some examples, the first surface 214 at the contact portion 215 is aligned in a plane that is parallel with the plane A4. In some examples, the second surface 216 at the contact portion 215 is aligned in a plane that is parallel with the plane A4. In some examples, the second surface 216 at the contact portion 215 is linear (or flat). In some examples, the contact portion 215 is disposed at a location that is offset from a location of the base portion 210 in the direction A1. In some examples, the contact portion 215 is disposed below the base portion 210 in the direction A1. In some examples, the first surface 214 at the contact portion 215 is disposed below the second surface 216 at the base portion 210 (e.g., below the plane A4). In some examples, at least a portion of the contact portion 215 is aligned with a portion of the semiconductor die 204 in the direction A2. In some examples, the second surface 216 at the contact portion 215 is aligned with at least a portion of the semiconductor die 204 in the direction A2.

The extender portion 212 includes one or more portions that extend between the contact portion 215 and the base portion 210. In some examples, the extender portion 212 includes one or more curved portions that connect the contact portion 215 with the base portion 210. In some examples, the extender portion 212 includes a curved portion 218, a central portion 211, and a curved portion 213. The curved portion 213 extends from the base portion 210. In some examples, the curved portion 213 extends away from the semiconductor die 204 in the direction A1. The central portion 211 extends from the curved portion 213. In some examples, the central portion 211 includes portions that extend above the base portion 210 in the direction A1. In some examples, the first surface 214 at the central portion 211 extends above the first surface 214 at the base portion 210. In some examples, the second surface 216 at the central portion 211 is disposed between the first surface 214 at the base portion 210 and the second surface 216 at the base portion 210. The curved portion 218 extends between the contact portion 215 and the central portion 211. In some examples, the curved portion 218 extends across the plane A4. In some examples, the curved portion 218 has a length that is larger than a length of the curved portion 213. In some examples, the central portion 211 has a length (e.g., in the direction A2) that is larger than the length of the contact portion 215 (e.g., in the direction A2). In some examples, the central portion 211 has a length (e.g., in the direction A2) that is smaller than the length of the base portion 210 (e.g., in the direction A2). The base portion 210 may define a central axis that extends in the direction A2 at a midpoint between the first surface 214 at the base portion 210 and the second surface 216 at the base portion 210. The contact portion 215 may define a central axis that extends in the direction A2 at a midpoint between the first surface 214 at the contact portion 215 and the second surface 216 at the contact portion 215. The central portion 211 may define a central axis that extends in the direction A2 at a midpoint between the first surface 214 at the central portion 211 and the second surface 216 at the central portion 211. In some examples, the central axis of the contact portion 215 is offset from the central axis of the base portion 210 in the direction A2 by a first distance. In some examples, the central axis of the central portion 211 is offset from the central axis of the base portion 210 in the direction A2 by a second distance. In some examples, the second distance is less than the first distance.

A protrusion 220 may extend from the body of the clip member 206 in a direction away from a surface of the clip member 206 such that at least a portion of the protrusion 220 can be inserted into a corresponding hole 232 when the guide member 230 is placed on top of the clip member 206. In some examples, the protrusions 220 extend from the base portion 210 in the direction A1. In some examples, the protrusions 220 may be considered horn members. In some examples, the protrusions 220 extend from the sidewalls, e.g., the first sidewall 231 and the second sidewall 233. The first protrusion 220-1 may extend from the first sidewall 231. The second protrusion 220-2 may extend from the second sidewall 233. In some examples, the first protrusion 220-1 may extend from the first sidewall 231 at a location along the direction A2 that is the same as the location of the second protrusion 220-2 along the second sidewall 233. The first protrusion 220-1 has a height that extends in the direction A1. The second protrusion 220-2 has a height that extends in the direction A1. In some examples, the height of the second protrusion 220-2 is the same as the height of the first protrusion 220-1.

In some examples, the first protrusion 220-1 is aligned with the second protrusion 220-2 along the direction A3. In some examples, the second protrusion 220-2 is the same as the first protrusion 220-1 (e.g., same height, width, length, shape, etc.). In some examples, each of the first protrusion 220-1 and the second protrusion 220-2 may include an end surface 224, and a curved portion 222. The end surface 224 may define the end of a respective protrusion in the direction A1. In some examples, the end surface 224 is disposed in a plane parallel with the direction A2 and/or direction A3. In some examples, the end surface 224 has a square shape. In some examples, the end surface 224 has a round shape.

The guide member 230 may be considered a guide jig or a top guide. The guide member 230 may be positioned on top of the clip member 206 such that the protrusions 220 are inserted (e.g., at least partially inserted) into the holes 232 defined by the guide member 230. For example, a first hole 232-1 receives at least a portion of the first protrusion 220-1, and a second hole 232-2 receives at least a portion of the second protrusion 220-2. In some examples, the holes 232 extend entirely through the guide member 230 in the direction A1. In some examples, the holes 232 extend only partially through the guide member 230 in the direction A1. In some examples, the holes 232 have a circular or oval shape. In some examples, the holes 232 have a square or rectangular shape.

In some examples, the guide member 230 has a cuboid shape. However, the guide member 230 may be other types of shapes. The guide member 230 includes a first surface 252 and a second surface 254. The second surface 254 may be parallel with the first surface 252. The distance between the first surface 252 and the second surface 254 may define a thickness of the guide member 230 in the direction A1. The guide member 230 includes a first edge 251 and a second edge 253. The second edge 253 is parallel with the first edge 251. The distance between the first edge 251 and the second edge 253 may define a length of the guide member 230 in the direction A2. In some examples, the length of the guide member 230 is greater than the length of the clip member 206. The guide member 230 includes a first sidewall 255 and a second sidewall 257. The second sidewall 257 may be parallel with the first sidewall 255. The distance between the first sidewall 255 and the second sidewall 257 may define a width of the guide member 230 in the direction A3. In some examples, the width of the guide member 230 is greater than the width of the clip member 206.

The semiconductor die 204 may be any type of semiconductor device. The semiconductor die 204 may include a power converter. The semiconductor die 204 may include an electronic switch. In some examples, the semiconductor die 204 includes an insulated-gate bipolar transistor (IGBT) device. In some examples, the semiconductor die 204 includes a silicon carbide (SiC) semiconductor device. The substrate 202 includes a dielectric material. In some examples, the substrate 202 includes a single layer of dielectric material. In some examples, the substrate 202 includes multiple layers of dielectric material. In some examples, the substrate 202 includes a printed circuit board (PCB) substrate (e.g., a single layer of PCB or multiple layers of PCB). In some examples, the substrate 202 includes a direct bond copper (DBC) substrate. In some examples, the substrates 202 includes a non-electrically conducting substrate (e.g., ceramic) that is covered with an electrically conducting layer (e.g., copper) on at least one side (or both sides). In some examples, the perspective of FIG. 2A illustrates the electrically conducting layer of the substrate 202.

Figure 3:
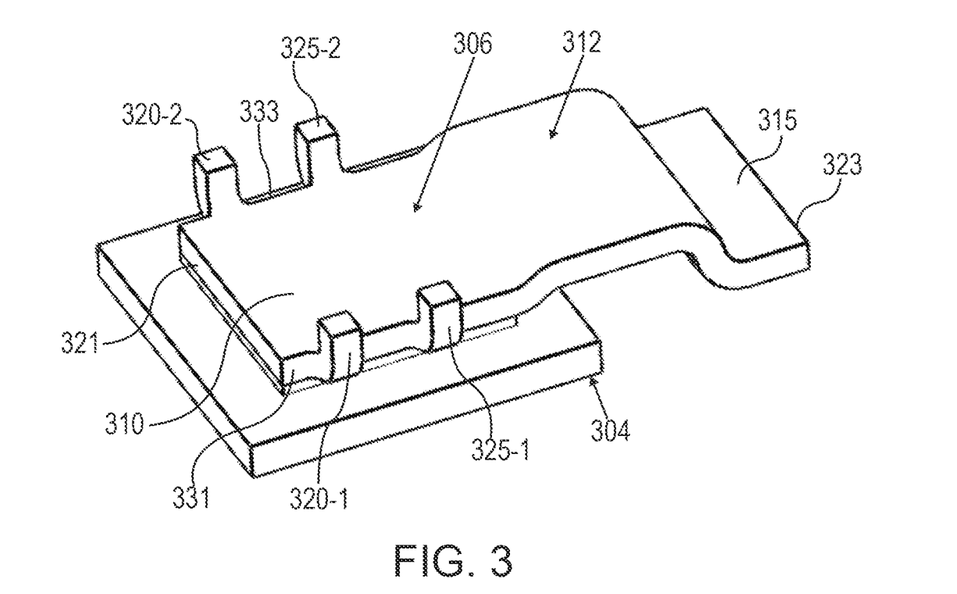
FIG. 3 illustrates a clip member according to another aspect.

FIG. 3 illustrates a clip member 306 according to another aspect. As shown in FIG. 3, the clip member 306 is coupled to the semiconductor die 304. The clip member 306 is an example of a clip member that can be used in the power electronic module 100 of FIGS. 1A and 1B and/or the power electronic module 200 of FIGS. 2A through 2G. The clip member 306 may include four protrusions, e.g., a first set of protrusions including a protrusion 320-1 and protrusion 320-2, and a second set of protrusions including a protrusion 325-1 and a protrusion 325-2. The clip member 306 may include any of the details discussed with reference to the clip member 206 of FIGS. 2A through 2G. In some examples, the clip member 306 is the same as the clip member 206 of FIGS. 2A through 2G except that the clip member 306 includes four protrusions (e.g., protrusion 320-1, protrusion 320-2, protrusion 325-1, protrusion 325-2).

The clip member 306 is configured to assist with securing the semiconductor die 304 to a substrate (e.g., the substrate 202 of FIGS. 2A through 2G) during a reflow process. The clip member 306 includes a plurality of protrusions (e.g., protrusion 320-1, protrusion 320-2, protrusion 325-1, and protrusion 325-2) that are configured to interact with a guide member (e.g., the guide member 230 of FIGS. 2A through 2G) in order to assist with keeping the clip member 306 in position during a reflow process. In some examples, after the reflow process, the guide member is then removed from the power electronic module. When the guide member is placed on top of the clip member 306, at least a portion of the protrusions are inserted into the holes defined by the guide member.

The clip member 306 includes a conductive material. In some examples, the clip member 306 includes a metal-based material or multiple metal-based materials. The clip member 306 includes a first edge 321 and a second edge 323 disposed opposite to the first edge 321. The clip member 306 includes a first sidewall 331 and a second sidewall 333 disposed opposite to the first sidewall 331.

The clip member 306 includes a base portion 310 and an extender portion 312 that extends from the base portion 310. In some examples, the base portion 310 and the extender portion 312 represent different areas of the clip member 306. In some examples, the base portion 310 and extender portion 312 are separate areas on a single (unified) piece of material. The base portion 310 may be an area of the clip member 306 that is positioned on top of the semiconductor die 304. The extender portion 312 may be an area of the clip member 306 that extends toward the substrate and includes an area that contacts the substrate. In some examples, the first edge 321 is defined by the edge of the base portion 310. In some examples, the second edge 323 is defined by the edge of the extender portion 312. The extender portion 312 includes a contact portion 315 that is coupled to the substrate via an adhesive material portion (e.g. the adhesive material portion 252-3 of FIGS. 2A through 2G).

A protrusion (e.g., 320-1, 320-2, 325-1, 325-2) may extend from the body of the clip member 306 in a direction away from a surface of the clip member 306 such that at least a portion of the protrusion can be inserted into a corresponding hole when the guide member is placed on top of the clip member 306. In some examples, the four protrusions extend from the base portion 310 of the clip member 306. In some examples, two protrusions (e.g., protrusion 320-1, protrusion 325-1) extend from the first sidewall 331 and two protrusions (e.g., protrusion 320-2, protrusion 325-2) extend from the second sidewall 333. The protrusion 320-1 may extend from the first sidewall 331, and the protrusion 320-2 may extend from the second sidewall 333. In some examples, the protrusion 320-1 may extend from the first sidewall 331 at a location that is aligned with the location of the protrusion 320-2 along the second sidewall 333. The protrusion 325-1 may extend from the first sidewall 331, and the protrusion 325-2 may extend from the second sidewall 333. In some examples, the protrusion 325-1 may extend from the first sidewall 331 at a location that is aligned with the location of the protrusion 325-2 along the second sidewall 333. In some examples, each of the protrusions in FIG. 3 have the same height.

Figure 4:
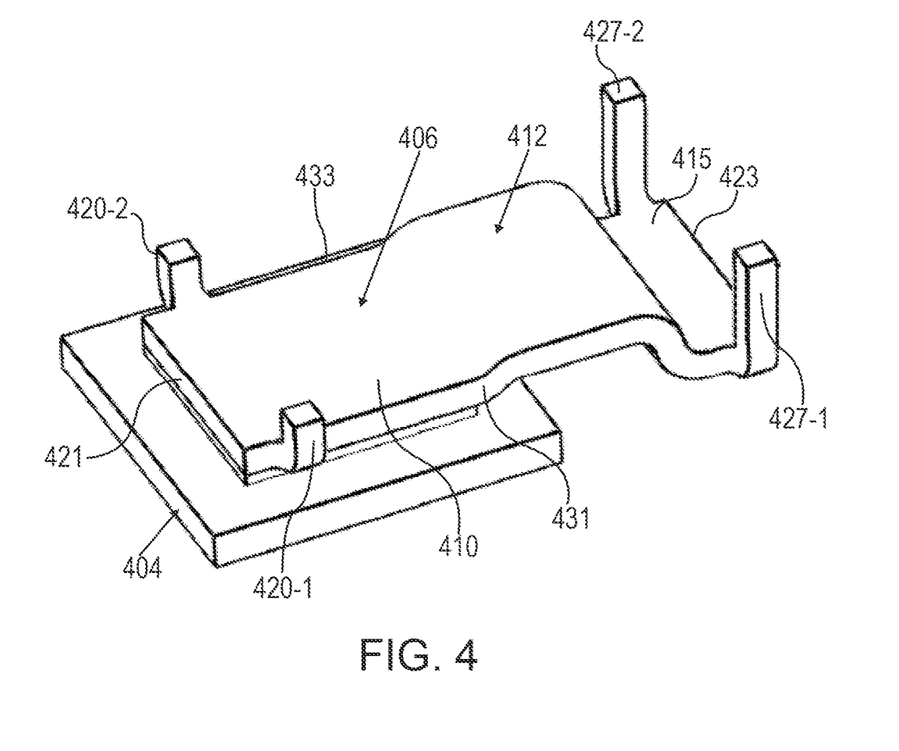
FIG. 4 illustrates a clip member according to another aspect.

FIG. 4 illustrates a clip member 406 according to another aspect. As shown in FIG. 4, the clip member 406 is coupled to the semiconductor die 404. The clip member 406 is an example of a clip member that can be used in the power electronic module 100 of FIGS. 1A and 1B and/or the power electronic module 200 of FIGS. 2A through 2G. The clip member 406 may include four protrusions, e.g., a protrusion 420-1, a protrusion 420-1, a protrusion 427-1, and a protrusion 427-2, where the protrusion 420-1 and the protrusion 420-2 are positioned on one end portion of the clip member 406 and the protrusion 427-1 and the protrusion 427-2 are positioned on the other end portion of the clip member 406. The clip member 406 may include any of the details discussed with reference to the clip member 106 of FIGS. 1A and 1B and/or the clip member 206 of FIGS. 2A through 2G. In some examples, the clip member 406 is the same as the clip member 206 of FIGS. 2A through 2G except that the clip member 406 includes four protrusions (e.g., the addition of two protrusions on the contact portion 415).

The clip member 406 is configured to assist with securing the semiconductor die 404 to a substrate (e.g., the substrate 202 of FIGS. 2A through 2G) during a reflow process. The clip member 406 includes a plurality of protrusions (e.g., the protrusion 420-1, the protrusion 420-2, the protrusion 427-1, and the protrusion 427-2) that are configured to interact with a guide member (e.g., the guide member 230 of FIGS. 2A through 2G) in order to assist with keeping the clip member 406 in position during a reflow process. In some examples, after the reflow process, the guide member is then removed from the power electronic module. When the guide member is placed on top of the clip member 406, at least a portion of the protrusions are inserted into the holes defined by the guide member.

The clip member 406 includes a conductive material. In some examples, the clip member 406 includes a metal-based material or multiple metal-based materials. The clip member 406 includes a first edge 421 and a second edge 423 disposed opposite to the first edge 421. The clip member 406 includes a first sidewall 431 and a second sidewall 433 disposed opposite to the first sidewall 431.

The clip member 406 includes a base portion 410 and an extender portion 412 that extends from the base portion 410. In some examples, the base portion 410 and the extender portion 412 represent different areas of the clip member 406. In some examples, the base portion 410 and extender portion 412 are separate areas on a single (unified) piece of material. The base portion 410 may be an area of the clip member 406 that is positioned on top of the semiconductor die 404. The extender portion 412 may be an area of the clip member 406 that extends toward the substrate and includes an area that contacts the substrate. In some examples, the first edge 421 is defined by the edge of the base portion 410. In some examples, the second edge 423 is defined by the edge of the extender portion 412. The extender portion 412 includes a contact portion 415 that is coupled to the substrate via an adhesive material portion (e.g. the adhesive material portion 252-3 of FIGS. 2A through 2G).

A protrusion (e.g., 420-1, 420-2, 427-1, 427-2) may extend from the body of the clip member 406 in a direction away from a surface of the clip member 406 such that at least a portion of the protrusion can be inserted into a corresponding hole when the guide member is placed on top of the clip member 406. In some examples, the two protrusions (e.g., 420-1, 420-2) extend from the base portion 410 of the clip member 406 and two protrusions (e.g., 427-1, 427-2) extend from the contact portion 215. In some examples, two protrusions (e.g., 420-1, 427-1) extend from the first sidewall 431 and two protrusions (e.g., 420-2, 427-2) extend from the second sidewall 433. The protrusion 420-1 may extend from the first sidewall 431, and the protrusion 420-2 may extend from the second sidewall 433. In some examples, the protrusion 420-1 may extend from the first sidewall 431 at a location that is aligned with the location of the protrusion 420-2 along the second sidewall 433. The protrusion 427-1 may extend from the first sidewall 431, and the protrusion 427-2 may extend from the second sidewall 433. In some examples, the protrusion 427-1 may extend from the first sidewall 431 at a location that is aligned with the location of the protrusion 427-2 along the second sidewall 433. The protrusion 420-1 may have a length (height) that is the same as the length (height) of the protrusion 420-2. The protrusion 427-1 may have a length (height) that is the same as the length (height) of the protrusion 427-2. In some examples, the length (height) of the protrusion 427-1 and the protrusion 427-2 is larger than the length (height) of the protrusion 420-1 and the protrusion 420-2.

Figure 5A:
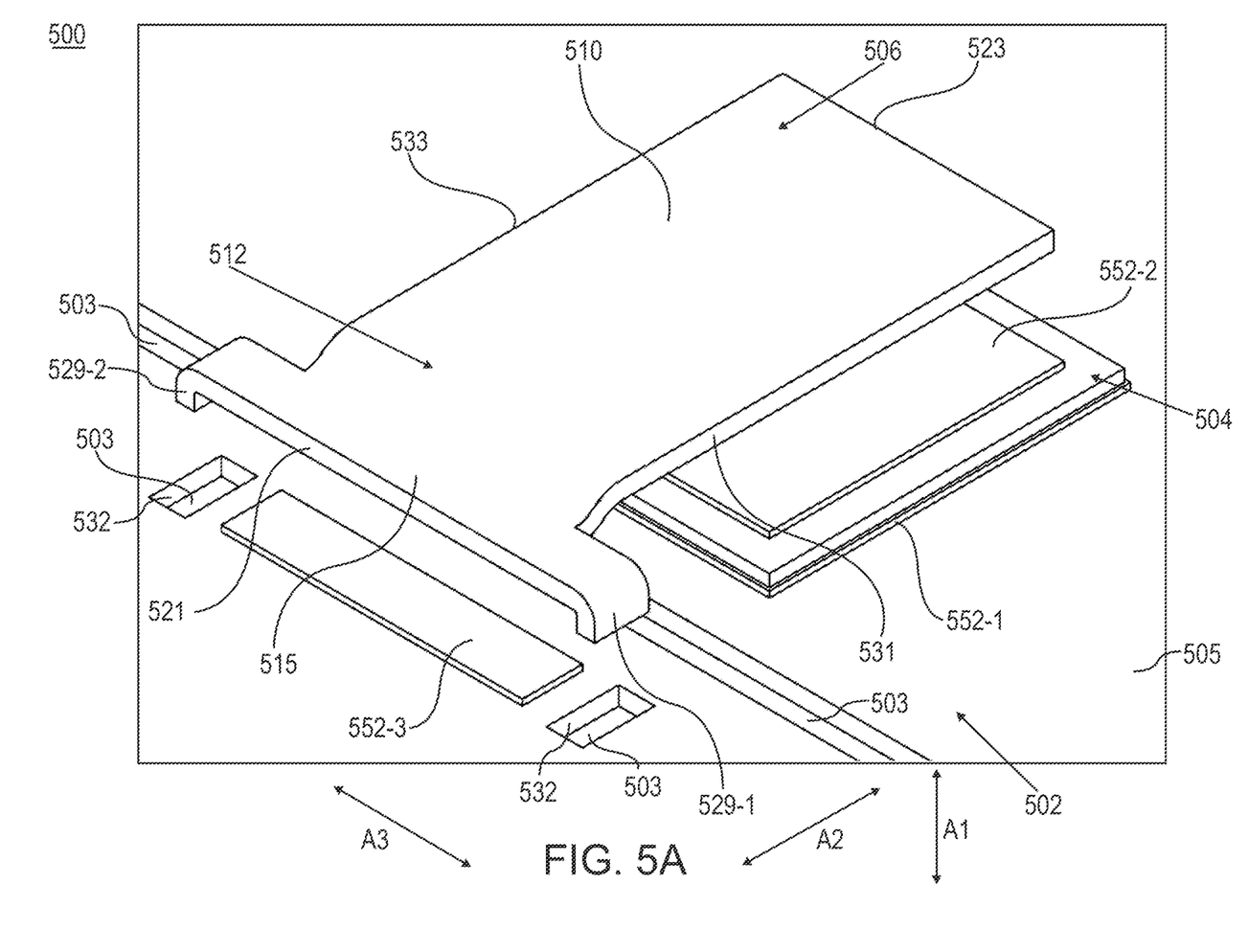
FIG. 5A illustrates a perspective of a power electronic module according to an aspect.
Figure 5B:
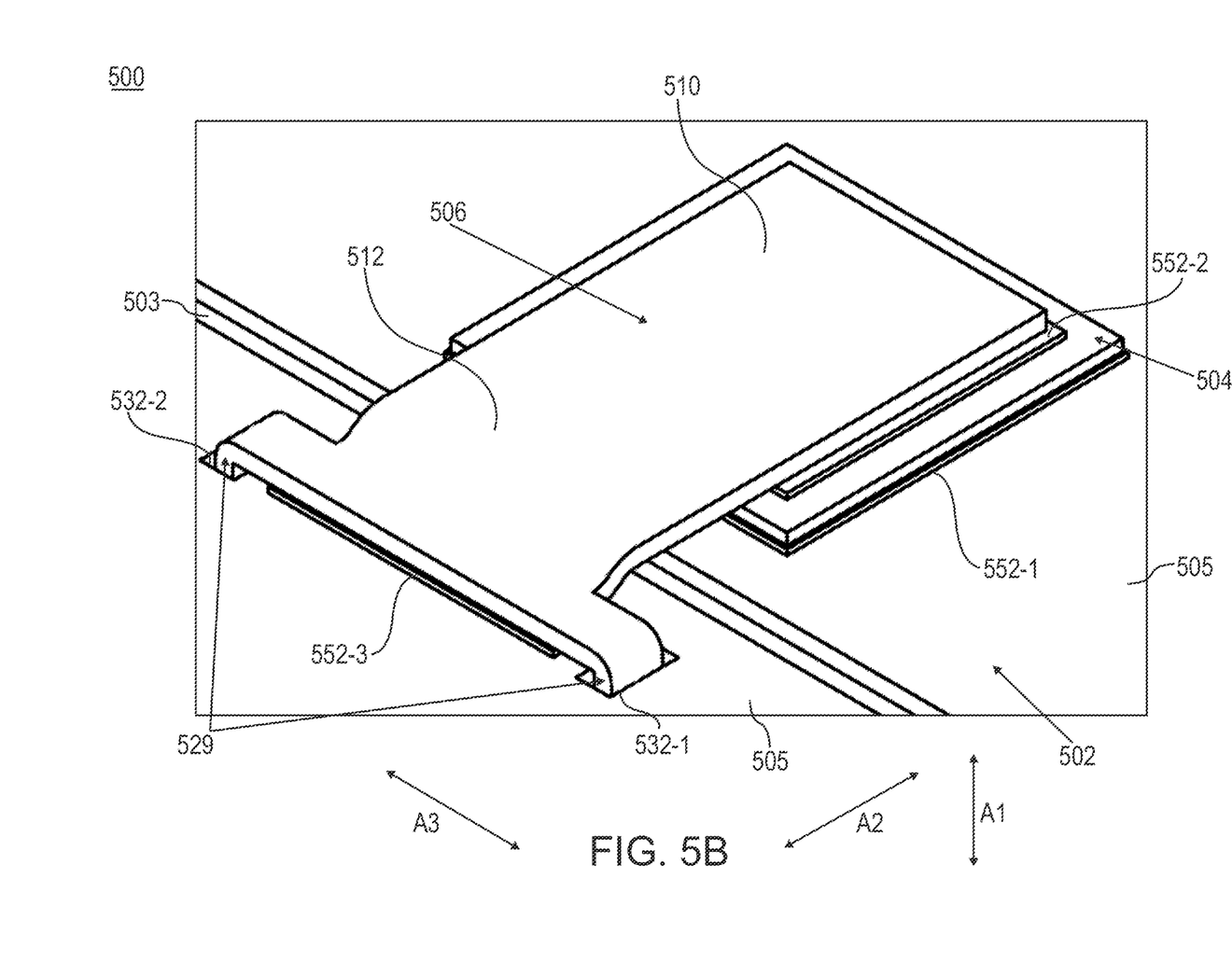
FIG. 5B illustrates a perspective of the power electronic module according to another aspect.

FIGS. 5A and 5B illustrate a power electronic module 500 according to an aspect. The power electronic module 500 includes a substrate 502, and a semiconductor die 504 coupled to the substrate 502 via an adhesive material portion 552-1. The power electronic module 500 includes a clip member 506, where the clip member 506 is coupled to the semiconductor die 504 via an adhesive material portion 552-2 and the clip member 506 is coupled to the substrate 502 via an adhesive material portion 552-3.

In some examples, the substrate 502 includes a direct bonded metal (DBM) substrate. In some examples, the substrate 502 includes a direct bonded copper (DBC) substrate. In some examples, the substrate 502 includes a non-electrically conducting substrate 503 and an electrically conducting layer 505. The electrically conducting layer 505 is coupled to the non-electrically conducting substrate 503. In some examples, the electrically conducting layer 505 is coupled to both sides (or surfaces) of the non-electrically conducting substrate 503. The non-electrically conducting substrate 503 includes a dielectric or insulating material. In some examples, the non-electrically conducting substrate 503 is a ceramic substrate. The electrically conducting layer 505 includes a metal layer. In some examples, the electrically conducting layer 505 includes a copper layer.

The clip member 506 is configured to assist with securing the semiconductor die 504 to the substrate 502 during a reflow process. In some examples, as explained above, the clip member 506 may become out of position during a reflow process in which the adhesive portions (e.g., 552-1, 552-2, 552-3) become heated (and soft). However, the clip member 506 includes a plurality of protrusions 529 that are inserted into slots 532 (e.g., mounting holes) defined on the substrate 502 in order to assist with keeping the clip member 506 in position during a reflow process. In some examples, the slots 532 are formed (e.g., etched) into the electrically conducting layer 505. In some examples, the slots 532 extend (at least partially) into the non-electrically conducting substrate 503. In some examples, the protrusions 529 are leg members.

The clip member 506 may be similar to the clip member 206 of FIGS. 2A through 2G except that the clip member 506 defines protrusions 529 on a contact portion 515 of the clip member 506, where at least a portion of the protrusions 529 are inserted into the slots 532 defined on the substrate 502. In some examples, the power electronic module 500 does not use a guide member during the reflow process.

The clip member 506 includes a conductive material. In some examples, the clip member 506 includes a metal-based material or multiple metal-based materials. The clip member 506 includes a first edge 521 and a second edge 523 disposed opposite to the first edge 521. The clip member 506 includes a first sidewall 531 and a second sidewall 533 disposed opposite to the first sidewall 531. The second edge 523 may be parallel with the first edge 521. The distance between the first edge 521 and the second edge 523 may define the length of the clip member 506 in the direction A2. In some examples, the first edge 521 is a flat (or substantially flat) surface that extends in the direction A1. In some examples, the second edge 523 is a flat (or substantially flat) surface that extends in the direction A1.

The first sidewall 531 may define one side surface of the clip member 506 and the second sidewall 533 may define the other side surface of the clip member 506. The second sidewall 533 may be parallel with the first sidewall 531. The distance between the first sidewall 531 and the second sidewall 533 may define a width of the clip member 506 in the direction A3. In some examples, the length of the clip member 506 is greater than the width of the clip member 506. In some examples, the first sidewall 531 and/or the second sidewall 533 includes one or more linear portions and one or more curved (or bent) portions.

The clip member 506 includes a base portion 510 and an extender portion 512 that extends from the base portion 510. In some examples, the base portion 510 and the extender portion 512 represent different areas of the clip member 506. In some examples, the base portion 510 and extender portion 512 are separate areas on a single (unified) piece of material. The base portion 510 may be an area of the clip member 506 that is positioned on top of the semiconductor die 504. The extender portion 512 may be an area of the clip member 506 that extends toward the substrate 502 (in the direction A2) and includes an area that contacts the substrate 502. In some examples, the first edge 521 is defined by the edge of the base portion 510. In some examples, the second edge 523 is defined by the edge of the extender portion 512.

The base portion 510 may be linear (or flat). The base portion 510 is coupled to the semiconductor die 504 via the adhesive material portion 552-2. The extender portion 512 includes a contact portion 515 that is coupled to the substrate 502 via the adhesive material portion 552-3. In some examples, the contact portion 515 is disposed at a location that is offset from a location of the base portion 510 in the direction A1. In some examples, the contact portion 515 is disposed below the base portion 510 in the direction A1.

The extender portion 512 includes one or more portions that extend between the contact portion 515 and the base portion 510. In some examples, the extender portion 512 includes one or more curved portions that connect the contact portion 515 with the base portion 510. In some examples, the extender portion 512 includes a curved portion (e.g., the curved portion 218 of FIGS. 2A through 2G), a central portion (e.g., the central portion 211 of FIGS. 2A through 2G), and a curved portion (e.g., the curved portion 213 of FIGS. 2A through 2G).

The protrusions 529 may include a first protrusion 529-1 and a second protrusion 529-2. The first protrusion 529-1 may extend in the direction A1. In some examples, the first protrusion 529-1 includes a portion that extends in the direction A3 and a portion that extends in the direction A1. The first protrusion 529-1 may extend from the contact portion 515. The second protrusion 529-2 may extend in the direction A1. In some examples, the second protrusion 529-2 includes a portion that extends in the direction A3 and a portion that extends in the direction A1. The second protrusion 529-2 may extend from the contact portion 515. In some examples, the distance between the first protrusion 529-1 and the second protrusion 529-2 in the direction A3 is greater than the distance between the first sidewall 531 and the second sidewall 533.

The substrate 502 defines slots 532 that are configured to receive at least a portion of the protrusions 529. In some examples, the slots 532 are referred to as mounting holes. In some examples, the slots 532 are formed (e.g., etched) into the electrically conducting layer 505 of the substrate 502. In some examples, the slots 532 extend only through a portion of the electrically conducting layer 505. In some examples, the slots 532 extend through the entirety of the electrically conducting layer 505. In some examples, the slots 532 also extend through a portion of the non-electrically conducting substrate 503. The slots 532 may include a first slot 532-1 that receives at least a portion of the first protrusion 529-1 and a second slot 532-2 that receives at least a portion of the second protrusion 529-2. In some examples, the adhesive material portion 552-3 is disposed between the first slot 532-1 and the second slot 532-2.

The semiconductor die 504 may be any type of semiconductor device. The semiconductor die 504 may include a power converter. The semiconductor die 504 may include an electronic switch. In some examples, the semiconductor die 504 includes an insulated-gate bipolar transistor (IGBT) device. In some examples, the semiconductor die 504 includes a silicon carbide (SiC) semiconductor device.

Figure 6:
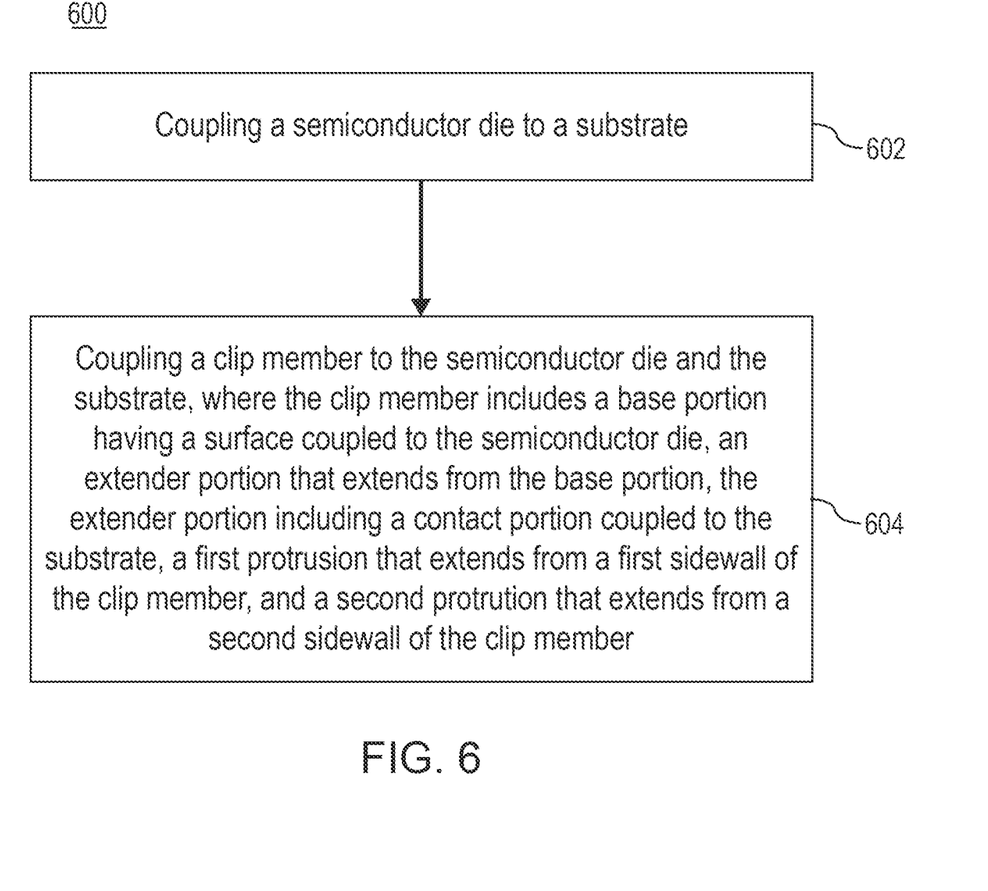
FIG. 6 illustrates a flowchart depicting example operations of assembling a power electronic module according to an aspect.

FIG. 6 depicts a flowchart 600 depicting example operations of assembling a power electronic module. Although the flowchart 600 is explained with reference to the power electronic module 100 of FIGS. 1A and 1B, the flowchart 600 may be applicable to any of the embodiments discussed herein. Although the flowchart 600 of FIG. 6 illustrates operations in sequential order, it will be appreciated that this is merely an example, and that additional or alternative operations may be included. Further, operations of FIG. 6 and related operations may be executed in a different order than that shown, or in a parallel or overlapping fashion.

Operation 602 includes coupling a semiconductor die 104 to a substrate 102.

Operation 604 includes coupling a clip member 106 to the semiconductor die 104 and the substrate 102, where the clip member 106 includes a base portion 110 having a surface (e.g., the second surface 116) coupled to the semiconductor die 104, and an extender portion 112 that extends from the base portion 110. The extender portion 112 includes a contact portion 115 coupled to the substrate 102. The clip member 106 includes a first protrusion (e.g., 120, 125, 127, or 129) that extends from a first sidewall 131 of the clip member 106, and a second protrusion (e.g., 120, 125, 127, or 129) that extends from a second sidewall 133 of the clip member 106.

In some examples, the operations include placing a guide member (e.g., guide member 230 of FIGS. 2A through 2G) on top of the clip member 106 such that at least a portion of the first and second protrusions is disposed within holes (e.g., holes 232 of FIGS. 2A through 2G) of the guide member. In some examples, the substrate 102 defines a first slot (e.g., slot 532 of FIGS. 5A and 5B) and a second slot (e.g., slot 532 of FIGS. 5A and 5B). In some examples, the method includes inserting the first protrusion and the second protrusion into the first slot and the second slot, respectively.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A power electronic module comprising:
   a substrate;
   a semiconductor die coupled to the substrate; and
   a clip member configured to secure the semiconductor die to the substrate, the clip member including:
      a base portion having a first surface coupled to a surface of the semiconductor die, the base portion having a sidewall that extends between the first surface and a second surface of the base portion;
      an extender portion that extends from the base portion, the extender portion including a contact portion coupled to the substrate; and
      a protrusion that extends from the sidewall of the base portion in a direction away from the surface of the semiconductor die, the protrusion configured to align with a guide member.

2. The power electronic module of claim 1, wherein the extender portion also includes a first curved portion, a second curved portion, and a central portion that is between the first curved portion and the second curved portion.

3. The power electronic module of claim 1, further comprising:

the guide member including a hole,
wherein the protrusion has a portion that extends into the hole.

4. The power electronic module of claim 1, wherein the sidewall is a first sidewall, and the protrusion is a first protrusion, the base portion including a second sidewall, wherein the clip member includes a second protrusion that extends from the second sidewall.

5. The power electronic module of claim 1, wherein the protrusion includes a curved portion and an end surface, the end surface extend above the second surface of the base portion.

6. The power electronic module of claim 1, wherein the substrate includes an electrically insulating layer and one or more electrically conducting layers.

7. The power electronic module of claim 4, wherein the first protrusion extends from the first sidewall at a first location, the second protrusion extends from the second sidewall at a second location, the first location being aligned with the second location.

8. The power electronic module of claim 7, wherein the first protrusion and the second protrusion are configured to be inserted into a first hole and a second hole, respectively, of a guide member during a reflow process.

9. The power electronic module of claim 4, wherein the clip member includes a third protrusion that extends from the contact portion, and a fourth protrusion that extends from the contact portion.

10. The power electronic module of claim 4, wherein the clip member includes a third protrusion that extends from the first sidewall of the base portion, and a fourth protrusion that extends from the second sidewall of the base portion.

11. The power electronic module of claim 9, wherein the first protrusion has a height that is less than a height of the third protrusion.

12. A power electronic module comprising:
a substrate;
a semiconductor die coupled to the substrate via a first adhesive portion;
a guide member having a hole; and
a clip member configured to secure the semiconductor die to the substrate, the clip member including:
 a base portion having a first surface coupled to a surface of the semiconductor die via a second adhesive portion, the base portion having a sidewall that extends between the first surface and a second surface of the base portion;
 an extender portion that extends from the base portion, the extender portion including a contact portion coupled to the substrate via a third adhesive portion; and
 a protrusion that extends from the sidewall of the base portion, the protrusion extending into the hole of the guide member.

13. The power electronic module of claim 12, wherein the protrusion is a first protrusion, the base portion including a second sidewall that extends between the first surface of the base portion and the second surface of the base portion, the clip member including a second protrusion that extends from the second sidewall.

14. The power electronic module of claim 12, wherein the extender portion also includes a first curved portion, a second curved portion, and a central portion that is between the first curved portion and the second curved portion.

15. The power electronic module of claim 12, wherein the clip member includes a third protrusion that extends from the contact portion, and a fourth protrusion that extends from the contact portion, wherein the first and second protrusions have a height that is less than a height of the third and fourth protrusions.

16. A power electronic module comprising:
a substrate defining a first slot and a second slot;
a semiconductor die coupled to the substrate via a first adhesive portion; and
a clip member configured to assist with securing the semiconductor die to the substrate, the clip member including:
 a base portion having a surface coupled to the semiconductor die via a second adhesive portion;
 an extender portion that extends from the base portion, the extender portion including a contact portion coupled to the substrate via a third adhesive portion, the third adhesive portion being located between the first slot and the second slot; and
 a first protrusion that extends from a first sidewall of the contact portion; and
 a second protrusion that extends from a second sidewall of the contact portion, at least a portion of the first protrusion being disposed in the first slot, at least a portion of the second protrusion being disposed in the second slot.

17. The power electronic module of claim 16, wherein the first protrusion has a first portion that extends in a first direction and a second portion that extends in a second direction, the second direction being perpendicular to the first direction.

18. The power electronic module of claim 16, wherein the extender portion includes a curved portion.

19. The power electronic module of claim 16, wherein the substrate includes a non-electrically conducting substrate and an electrically conducting layer coupled to at least one side of the electrically conducting substrate, the electrically conducting layer defining the first slot and the second slot.

20. A clip member for a power electronic module, the clip member comprising:
a base portion having a first surface configured to be coupled to a surface of a semiconductor die, the base portion having a sidewall that extends between the first surface and a second surface of the base portion, the base portion having a second sidewall that extends between the first surface of the base portion and the second surface of the base portion;
an extender portion that extends from the base portion, the extender portion including a contact portion configured to be coupled to a substrate;
a first protrusion that extends from the first sidewall; and
a second protrusion that extends from the second sidewall.

* * * * *